United States Patent
Gotoh et al.

(10) Patent No.: US 10,923,883 B2
(45) Date of Patent: Feb. 16, 2021

(54) OPTICAL DEVICE, OPTICAL UNIT, DISPLAY DEVICE, AND PRISM FIXING METHOD

(71) Applicants: Tokiko Gotoh, Kanagawa (JP); Noboru Kusunose, Tokyo (JP)

(72) Inventors: Tokiko Gotoh, Kanagawa (JP); Noboru Kusunose, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 164 days.

(21) Appl. No.: 16/309,293

(22) PCT Filed: Jun. 16, 2017

(86) PCT No.: PCT/JP2017/022343
§ 371 (c)(1),
(2) Date: Dec. 12, 2018

(87) PCT Pub. No.: WO2017/217536
PCT Pub. Date: Dec. 21, 2017

(65) Prior Publication Data
US 2019/0260183 A1    Aug. 22, 2019

(30) Foreign Application Priority Data
Jun. 17, 2016  (JP) .................................. 2016-120630

(51) Int. Cl.
*G02B 26/08* (2006.01)
*G02B 26/10* (2006.01)
(Continued)

(52) U.S. Cl.
CPC .......... *H01S 5/4012* (2013.01); *G02B 7/1805* (2013.01); *G02B 26/0833* (2013.01);
(Continued)

(58) Field of Classification Search
CPC .......... G02B 7/00; G02B 7/18; G02B 7/1805; G02B 7/181
See application file for complete search history.

(56) References Cited

U.S. PATENT DOCUMENTS 4,261,646 A      4/1981  Kotaka
5,978,404 A  *  11/1999  Ishihara ................. G11B 7/127
                                                                372/43.01
(Continued)

FOREIGN PATENT DOCUMENTS

CN       102087399 B     9/2012
EP         0703088 A2    3/1996
(Continued)

OTHER PUBLICATIONS

English translation of JP2000321480A (Year: 1999).*
(Continued)

*Primary Examiner* — Robert E. Tallman
(74) *Attorney, Agent, or Firm* — Oblon, McClelland, Maier & Neustadt, L.L.P.

(57) ABSTRACT

An optical device includes a rectangular parallelepiped prism including a reflection-transmission surface for reflecting and transmitting light fluxes, a seating surface provided so that a bottom surface of the prism is fixed by an adhesive, and a groove portion provided in a part of the periphery of the seating surface. When the prism is fixed to the seating surface by the adhesive, the groove portion is configured to be capable of receiving the adhesive protruded from between the bottom surface of the prism and the seating surface when the prism is pressed against a first positioning member for determining a position of the prism so that a first side face of the prism is along a predetermined straight line and against a second positioning member for restricting a (Continued)

second side face orthogonal to the first side face of the prism from moving in the direction of the straight line.

15 Claims, 5 Drawing Sheets (51) Int. Cl.
G02B 7/18 (2006.01)
G02B 27/01 (2006.01)
H01S 5/40 (2006.01)
H01S 5/022 (2006.01)

(52) U.S. Cl.
CPC .......... *G02B 26/10* (2013.01); *H01S 5/02248* (2013.01); *H01S 5/02288* (2013.01); *H01S 5/4093* (2013.01); *G02B 27/0101* (2013.01)

(56) References Cited

U.S. PATENT DOCUMENTS

| | | |
|---|---|---|
| 2006/0055769 A1 | 3/2006 | Yamazaki et al. |
| 2007/0188589 A1 | 8/2007 | Kusunose et al. |
| 2008/0024851 A1 | 1/2008 | Sakaue et al. |
| 2008/0225304 A1 | 9/2008 | Sakaue et al. |
| 2009/0022520 A1 | 1/2009 | Sakaue et al. |
| 2009/0058981 A1 | 3/2009 | Higaki et al. |
| 2009/0066780 A1 | 3/2009 | Bannai et al. |
| 2009/0289950 A1* | 11/2009 | Hamano ............... H04N 9/3129 345/589 |
| 2011/0128602 A1 | 6/2011 | Hamano et al. |
| 2011/0286067 A1 | 11/2011 | Iwamatsu et al. |
| 2011/0298925 A1 | 12/2011 | Inoue et al. |
| 2011/0316957 A1 | 12/2011 | Sakaue et al. |
| 2012/0300007 A1 | 11/2012 | Fujii et al. |
| 2013/0120734 A1 | 5/2013 | Ogata et al. |
| 2013/0135859 A1 | 5/2013 | Inoue et al. |
| 2013/0141766 A1 | 6/2013 | Iwamatsu et al. |
| 2013/0188004 A1 | 7/2013 | Arai et al. |
| 2013/0194370 A1 | 8/2013 | Sakaue et al. |
| 2013/0222865 A1 | 8/2013 | Iwamatsu et al. |
| 2013/0329414 A1 | 12/2013 | Kusunose |
| 2015/0062668 A1 | 3/2015 | Iwamatsu et al. |
| 2015/0261120 A1 | 9/2015 | Fujii et al. |

FOREIGN PATENT DOCUMENTS

| | | |
|---|---|---|
| JP | 61-282808 A | 12/1986 |
| JP | 63-304222 A | 12/1988 |
| JP | 5-323167 A | 12/1993 |
| JP | 11-134656 A | 5/1999 |
| JP | 2000-321480 | 11/2000 |
| JP | 2003-177289 A | 6/2003 |
| JP | 2006-251517 | 9/2006 |
| JP | 2010-032796 | 2/2010 |
| JP | 2010-049232 | 3/2010 |
| JP | 5398894 | 11/2013 |
| JP | 2014-160125 | 9/2014 |
| JP | 2015-148665 | 8/2015 |
| JP | 2016-45231 A | 4/2016 |
| WO | WO2011/142210 A1 | 11/2011 |

OTHER PUBLICATIONS

International Search Report and Written Opinion dated Oct. 2, 2017 in PCT/JP2017/022343 filed Jun. 16, 2017.

Japanese Office Action dated Feb. 25, 2020, in Patent Application No. 2016-120630, 3 pages.

Japanese Office Action dated Nov. 19, 2019 in Japanese Patent Application No. 2016-120630, citing documents AO, AP and AQ therein, 3 pages.

European Office Action dated Oct. 12, 2020 in European Patent Application No. 17734847.1, citing document AO therein, 16 pages.

\* cited by examiner

OPTICAL DEVICE, OPTICAL UNIT, DISPLAY DEVICE, AND PRISM FIXING METHOD

TECHNICAL FIELD

The present invention relates to an optical device, an optical unit, a display device, and a prism fixing method.

BACKGROUND ART

Prisms such as dichroic prisms and beam splitter prisms are used in a projector or the like as optical components for color separation and color synthesis. A plurality of these components are generally used and are in many cases fixed with an adhesive such as ultraviolet curable resin. Also, a relative positional relationship of a light incident surface, such as displacement of pixels of each color light and deviation of an optical axis, directly affects image quality. Therefore, a high-precision and stable fixing method is required for the optical components.

For example, Japanese Patent No. 5398894 (Patent Literature 1) discloses a prism unit in which a prism base includes at least three seating surfaces attached to a surface orthogonal to the reflective surfaces of the prism and an adhesive seating-surface portion adhered to the prism by an adhesive and having a height lower than at least the three seating surfaces, in which the shape of at least the three seating surfaces is circular or polygonal, in which a groove portion having a shape along the shape of at least the three seating surfaces is formed between at least the three seating surfaces and the adhesive seating-surface portion, and in which the seating surfaces and the groove portion are adjacent to each other and the groove portion and the adhesive seating-surface portion are adjacent to each other.

SUMMARY OF INVENTION

Technical Problem

However, in the conventional fixing method of the prism such as the dichroic prism, because the bottom surface of the prism and a base plate or the like are directly adhered, when the thickness of an adhesive layer interposed therebetween is not exactly uniform, the prism is likely to be tilted without standing upright on the base plate.

In order to solve this drawback, a method is known in which the heights of seating surfaces are made constant by providing a plurality of seating surfaces, an adhesive reservoir lower than the seating surfaces, and an adhesive removal groove around the seating surfaces and by separating the prism seating surface from an adhesive applied surface so as not to attach the adhesive to the seating surfaces. Here, a target prism is a large prism with one side of the contact surface exceeding 10 mm. This is because, for a prism of 10 mm or less, it is difficult to machine a die for manufacturing a seating surface (receiving surface) and it becomes more difficult to machine it when three seating surfaces are provided. It is also difficult to set the prism to the seating surface and apply an adhesive thereto, which may result in erroneous application to the seating surface (prism contact surface).

It is an object of the present invention to at least partially solve the problems in the conventional technology.

Solution to Problem

According to an embodiment, there is provided an optical device comprising: a rectangular parallelepiped prism configured to include a reflection-transmission surface for reflecting and transmitting light fluxes; a seating surface provided so that a bottom surface of the prism is fixed by an adhesive; and a groove portion provided in at least a part of the periphery of the seating surface, wherein the groove portion is formed so as to be capable of receiving the adhesive protruded from between the bottom surface of the prism and the seating surface when the prism is pressed against a first member for determining a position of the prism so that a first side face of the prism is along a predetermined straight line and against a second member for restricting a second side face orthogonal to the first side face of the prism from moving in the direction of the straight line, at the time of fixing the prism to the seating surface by the adhesive.

Advantageous Effects of Invention

The above and other objects, features, advantages and technical and industrial significance of this invention will be better understood by reading the following detailed description of presently preferred embodiments of the invention, when considered in connection with the accompanying drawings.

DESCRIPTION OF EMBODIMENTS

Figure 1:
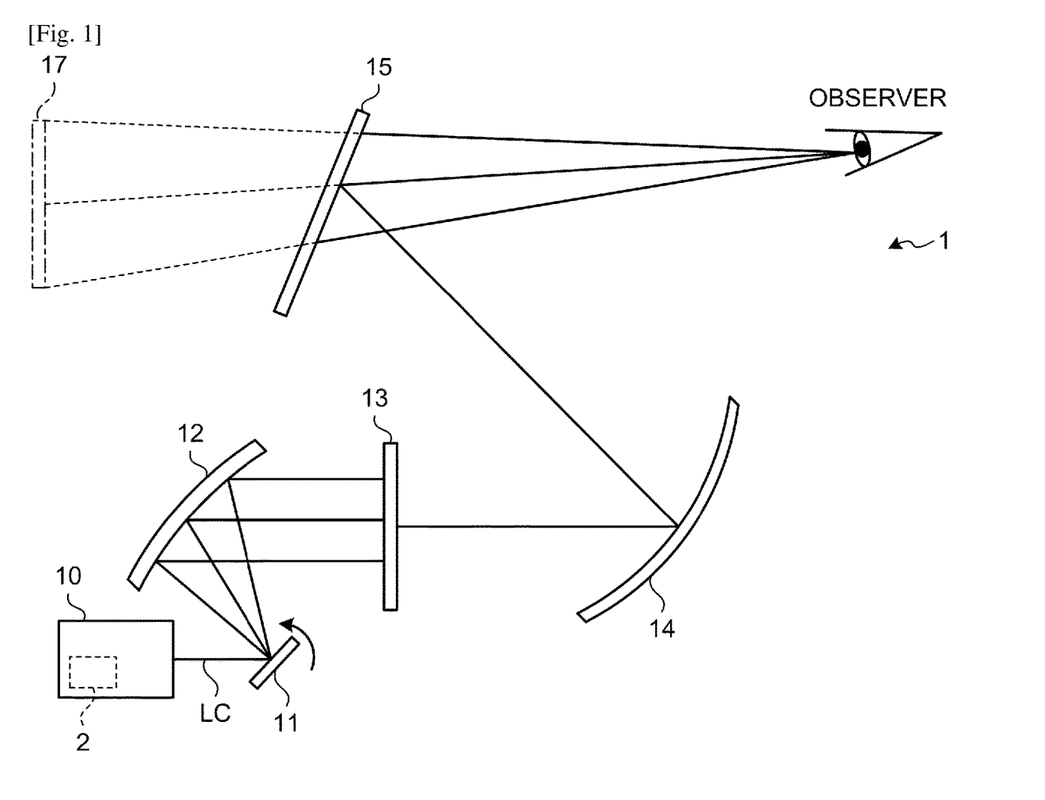
FIG. 1 is a diagram illustrating an overview of a display device according to an embodiment.

Exemplary embodiments of the present invention are described in detail below with reference to the accompanying drawings. FIG. 1 is a diagram illustrating an overview of a display device 1 according to an embodiment. The display device 1 is, for example, HuD (Head-up Display), and is mounted on a movable body such as a vehicle, an aircraft, and a ship.

The display device 1 includes, for example, a light source portion (optical unit) 10, a two-dimensional deflecting portion 11, a concave mirror 12, a scanned surface element 13, a concave mirror 14, and a reflective surface element 15, so that an observer can observe an enlarged virtual image 17.

The light source portion 10 is a laser light source that includes a prism unit (optical device) 2 (which is explained later with reference to FIG. 2) and emits a pixel display beam LC (laser light) for color image display. The pixel display beam LC is a beam obtained by combining beams of three colors of red (hereinafter, referred to as "R"), green (hereinafter, referred to as "G"), and blue (hereinafter, referred to as "B") into one beam, and the prism unit 2 combines R, G, B laser light fluxes into a single light flux, and irradiates the two-dimensional deflecting portion 11 with the light flux.

The two-dimensional deflecting portion 11 deflects the pixel display beam LC emitted from the light source portion 10 in a two-dimensional direction. For example, the two-dimensional deflecting portion 11 is configured to swing a micro-mirror on "two axes orthogonal to each other" as swing axes. That is, the two-dimensional deflecting portion 11 is MEMS (Micro Electro Mechanical Systems) or the like manufactured as a micro swinging mirror element in a semiconductor process or the like. Moreover, the two-dimensional deflecting portion 11 may be a combination, etc. of, for example, two micro-mirrors each swinging around one axis so that swinging directions are orthogonal to each other.

The pixel display beam LC deflected in the two-dimensional direction is irradiated to the concave mirror 12. The concave mirror 12 reflects the incident pixel display beam LC toward the scanned surface element 13. The optical action of the concave mirror 12 is to reflect incident pixel display beams LC deflected in the two-dimensional direction and to align the directions of the reflected pixel display beams LC in a certain direction.

In other words, the pixel display beam LC reflected by the concave mirror 12 is incident on the scanned surface element 13 while moving in parallel in association with the deflection by the two-dimensional deflecting portion 11, and scans the scanned surface element 13 in the two-dimensional direction. The scanned surface element 13 is, for example, a microlens array of a "fine convex lens structure". By scanning in the two-dimensional direction, "two-dimensional color image" is formed on the scanned surface element 13. It is needless to say that a pixel to be displayed at each moment is "only a pixel irradiated by the pixel display beam LC at that moment". In other words, a two-dimensional color image is formed as "a set of pixels displayed at respective moments" through scanning in the two-dimensional direction by the pixel display beam LC.

The concave mirror 14 reflects the light constituting the "two-dimensional color image" formed on the scanned surface element 13. In other words, the scanned surface element 13 and the concave mirror 14 constitute a virtual image forming optical system. "Virtual image forming optical system" forms the enlarged virtual image 17 of the two-dimensional color image. The reflective surface element 15 is provided on the front side of the imaging position of the enlarged virtual image 17, and reflects the light flux forming the enlarged virtual image 17 toward an observer side (represented by an observer's eye in the drawing). With this reflected light, the observer can visually recognize the enlarged virtual image 17.

Figure 2:
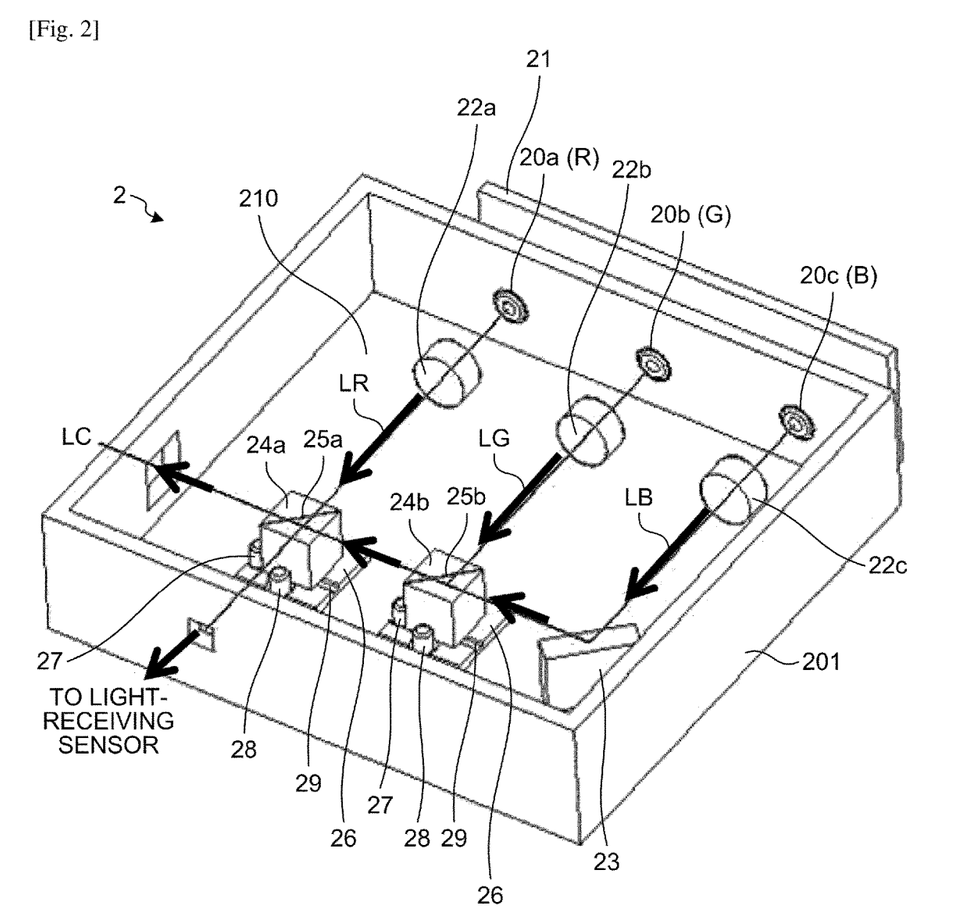
FIG. 2 is a perspective view illustrating a configuration example of a prism unit.

FIG. 2 is a perspective view illustrating a configuration example of the prism unit 2. Light sources 20a, 20b, and 20c are laser diodes or the like which are fixed to an LD substrate 21, and emit laser beams of R, G, and B, respectively. Coupling lenses 22a, 22b, and 22c suppress divergence of the laser beams of the colors respectively emitted from the light sources 20a, 20b, and 20c.

A laser light flux LB of B is deflected by a mirror 23 to enter a prism 24b. A laser light flux LG of G also enters the prism 24b. The prism 24b has a dichroic film 25b that transmits the laser light flux LB and reflects the laser light flux LG. In other words, the prism 24b is a rectangular parallelepiped prism in which one reflection-transmission surface (dichroic film 25b) that reflects a light flux of a predetermined wavelength and transmits a light flux of other wavelength is internally provided so as to be surrounded by at least four apexes and the bottom surface, and deflects the laser light flux LG and transmits the laser light flux LB to enter a prism 24a.

A laser light flux LR of R enters the prism 24a. The prism 24a has a dichroic film 25a that transmits the laser light fluxes LG and LB and reflects the laser light flux LR. In other words, the prism 24a is a rectangular parallelepiped prism in which one reflection-transmission surface (dichroic film 25a) that reflects a light flux of a predetermined wavelength and transmits a light flux of other wavelength is internally provided so as to be surrounded by at least four apexes and the bottom surface. Therefore, the laser light fluxes of the colors of LR, LG, and LB are combined into one light flux and emitted from the prism 24a. The light flux emitted from the prism 24a is converted into a "collimated beam" of a predetermined light flux diameter by a lens. This "collimated beam" is the pixel display beam LC.

The laser light fluxes of the R, G, and B colors that constitute the pixel display beam LC are intensity-modified by an image signal of "two-dimensional color image" to be displayed. The amount of emitted light is set based on the amount of light detected by a light-receiving sensor. The light-receiving sensor detects the light amounts of the laser light flux LR transmitted without being reflected by the prism 24a and of the laser light fluxes LG and LB not transmitted by the prism 24a.

The prism 24a and the prism 24b are fixed to respective seating surfaces 26 with an adhesive in a housing 201. In addition, the seating surfaces 26 are formed fixedly on a substrate 210 of the housing 201. In the present invention, the seating surfaces 26 may be formed separately from the substrate 210 of the housing 210. Alternatively, the seating surfaces 26 may be formed integrally with the substrate 210, in other words, a part of the substrate 210 may be configured to be functioned as the seating surface. The prism 24a and the prism 24b are positioned respectively by positioning member that includes first positioning members 27 and a second positioning member 28 at the time of being fixed. A groove portion 29 is formed in a part of the periphery of the seating surface 26.

Figure 3:
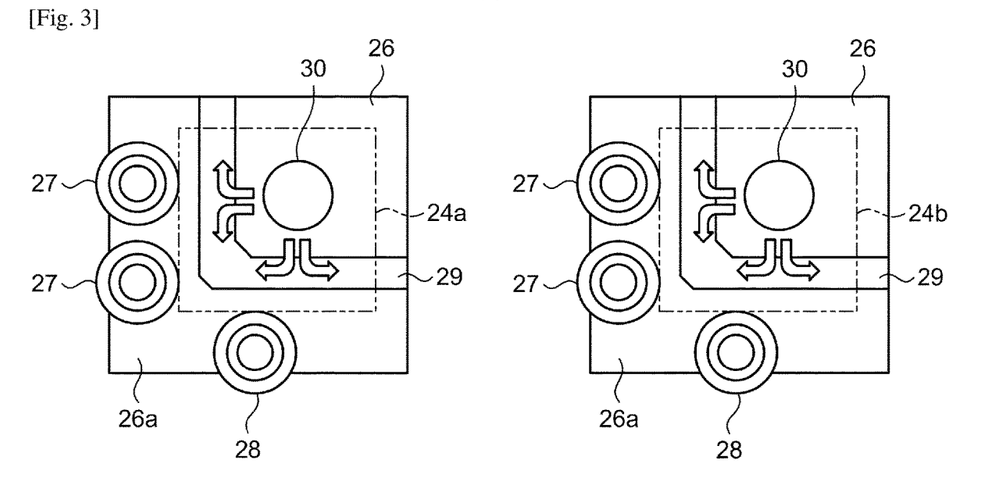
FIG. 3 is a diagram illustrating a state before a prism in the prism unit is fixed.
Figure 4:
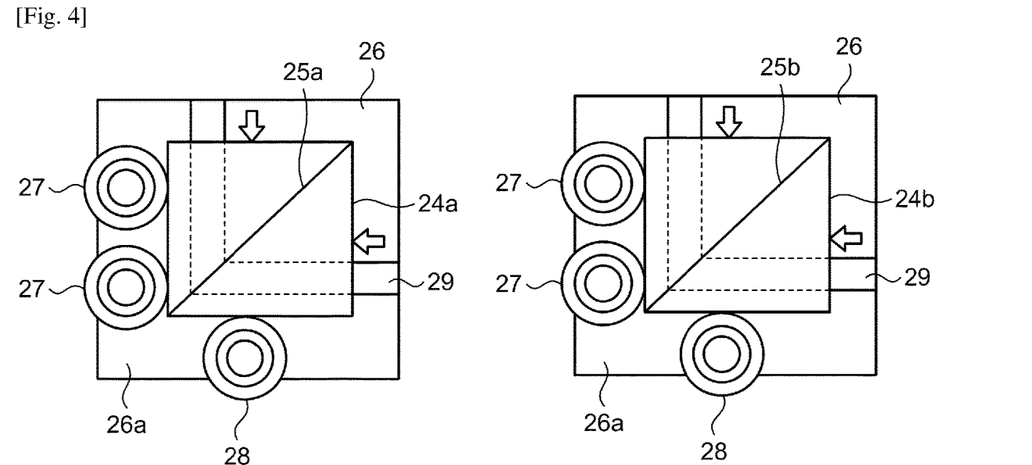
FIG. 4 is a diagram illustrating pressing directions when the prism in the prism unit is fixed.
Figure 5:
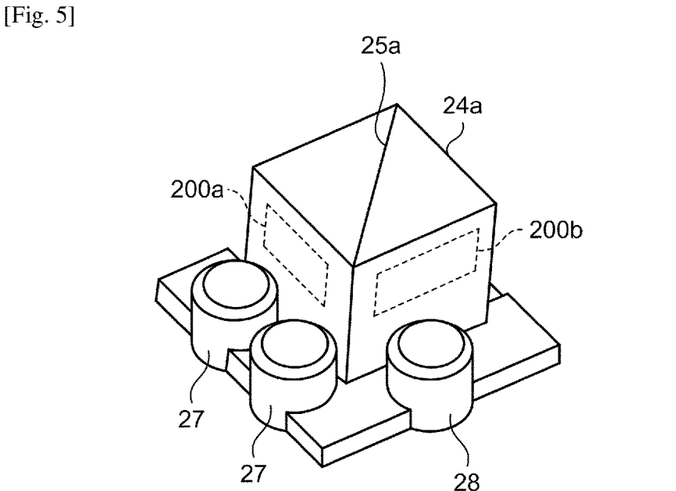
FIG. 5 is a perspective view illustrating a state in which the prism is fixed.

Then, how to fix the prism 24a and the prism 24b in the prism unit 2 will be explained in detail below with reference to FIG. 3 to FIG. 5. FIG. 3 is a diagram illustrating a state before the prism 24a and the prism 24b are fixed in the prism unit 2. FIG. 4 is a diagram illustrating pressing directions when the prism 24a and the prism 24b are fixed in the prism unit 2. FIG. 5 is a perspective view illustrating a state in which the prism 24a is fixed.

The seating surface 26 is provided so that the bottom surface (adhesive surface) of the prism 24a or the prism 24b is fixed by an adhesive. The respective seating surfaces 26 are preferably set so as to be equal to or slightly larger than the respective adhesive surfaces of the prism 24a and the prism 24b.

The prism 24a and the prism 24b are, for example, a rectangular parallelepiped (or cube) having a side length of 10 mm or less. Therefore, each one side of the seating surfaces 26 is also set to, for example, about 10 mm or less.

Because the seating surface 26 has a small area, each surface is further reduced when divided, which makes it difficult to perform processing and apply the adhesive thereto. On the other hand, because the seating surface 26 has a small area, variations in flatness of each area hardly occur. That is, the seating surface 26 does not need to be divided.

The adhesive surfaces of the prism 24a and the prism 24b have sufficient planarity. Therefore, by applying a uniform load to the surfaces opposite to the adhesive surfaces of the prism 24a and the prism 24b, the film thickness of the adhesive layer is made uniform, and thickness unevenness is eliminated. In other words, the prism 24a and the prism 24b are adhered thereto without tilting. Because each area of the seating surfaces 26 is narrow, the amount of adhesive is small, but the weight of the prism 24a and the prism 24b is light, so that it is possible to obtain sufficient adhesion.

The first positioning members 27 and the second positioning member 28 are provided near the respective seating surfaces 26. The first positioning members 27 are, for example, two reference pins and positions the prism 24a or the prism 24b so that its first side face is along a predetermined straight line. The second positioning member 28 is, for example, one reference pin and restricts a second side face orthogonal to the first side face of the prism 24a or the prism 24b from moving in the direction in which the straight line extends.

As illustrated in FIG. 13, etc., the groove portion 29 is provided between an adhesive applied position 30 and the first positioning members 27/the second positioning member 28. For example, the groove portion 29 is formed so that the length in the direction intersecting a direction from the seating surface 26 to the first positioning members 27 or to the second positioning member 28 is longer than the length in the direction from the seating surface 26 to the first positioning members 27 or to the second positioning member 28. A member surface 26a filling a space between the first positioning members 27/the second positioning member 28 and the groove portion 29 is set to be equal to or slightly lower than the height of the respective seating surfaces 26 and is set to be higher than the groove portion 29.

The prism 24a and the prism 24b are positioned by being pressed in the directions of the arrows illustrated in FIG. 4 when being adhered to the respective seating surfaces 26 by the adhesive. In addition, by pressing the prism 24a and the prism 24b against the respective seating surfaces 26, extra adhesive is pushed out, and the film thickness of the adhesive is made uniform.

As illustrated in FIG. 4, the prism 24a and the prism 24b are pressed in the directions of the arrows to come into contact with the first positioning members 27 and the second positioning member 28. Each of the prism 24a and the prism 24b may be pressed against the second positioning member 28 after being pressed against the first positioning members 27.

When the prism 24a and the prism 24b are adhered to the respective seating surfaces 26 by the adhesive, the extra adhesive crushed by the prism 24a and the prism 24b flows in the directions of the arrows illustrated in FIG. 3, and does not reach the first positioning members 27 and the second positioning member 28 even if it flows in the groove portion 29. Even if the extra adhesive flows between the first positioning members 27/the second positioning member 28 and the groove portion 29, it is a small amount, and the adhesive does not reach the first positioning members 27 and the second positioning member 28. Moreover, when the portion between the first positioning members 27/the second positioning member 28 and the groove portion 29 is set to be lower than the seating surface 26, the adhesive does not affect the attitudes of the prism 24a and the prism 24b after being fixed. Thereafter, the prism 24a and the prism 24b are reliably adhered to the respective seating surfaces 26 by being irradiated with ultraviolet rays and stored at a high temperature, or the like.

As illustrated in FIG. 5, the first positioning members 27 and the second positioning member 28 are provided so as not to block or damage optically effective areas 200a and 200b of the prism 24a (or prism 24b) through which a light flux passes. It is only necessary for the first positioning members 27 and the second positioning member 28 to be arranged so as not to block the passage of the light flux, and they may be arranged in the lower part of the optically effective areas 200a and 200b or may be arranged on the sides of the optically effective areas 200a and 200b.

Figure 6A:
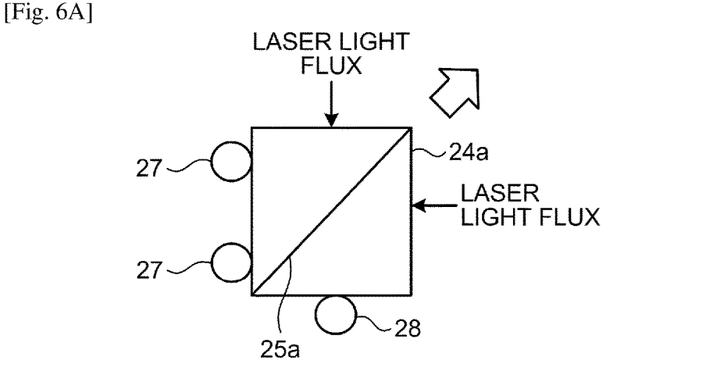
FIG. 6A is a diagram illustrating an example of a relationship between incident directions of laser light fluxes and positions where first positioning members and a second positioning member are provided.
Figure 6B:
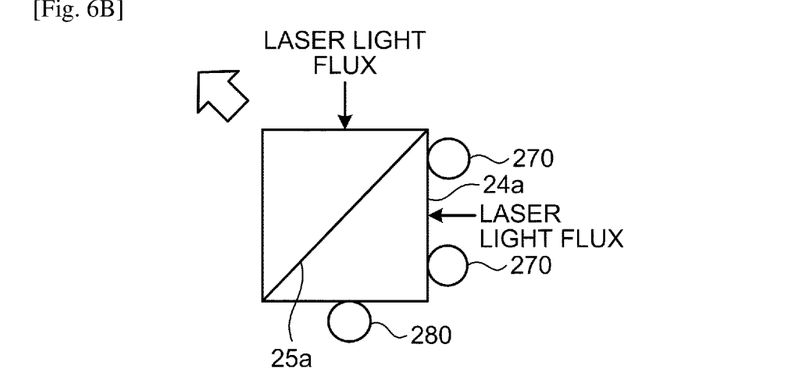
FIG. 6B is a diagram illustrating a comparative example of the relationship between incident directions of laser light fluxes and positions where the first positioning members and the second positioning member are provided.

A relationship between an incident direction of a laser light flux incident on the prism 24a (prism 24b) and positions where the first positioning members 27 and the second positioning member 28 are provided will be explained next. FIGS. 6A and 6B are diagrams illustrating a relationship between an incident direction of a laser light flux and positions where the first positioning members 27 and the second positioning member 28 are provided. FIG. 6A represents an example, and FIG. 6B represents a comparative example.

As in the example illustrated in FIG. 6A, when the first positioning members 27 and the second positioning member 28 are arranged so as to sandwich a plane including the dichroic film 25a, a direction, in which the prism 24a is likely to be displaced when it is positioned, is a direction of the arrow of FIG. 6A. In other words, even if the prism 24a is displaced in the direction in which the dichroic film 25a extends at the time of positioning, only the position where the light flux in the dichroic film 25a is transmitted or reflected is changed, and the direction in which the light flux is transmitted or reflected is not largely displaced.

On the other hand, as in the comparative example illustrated in FIG. 6B, when first positioning members 270 and a second positioning member 280 are arranged so as not to sandwich a plane including the dichroic film 25a, the direction, in which the prism 24a is likely to be displaced when it is positioned, is a direction of the arrow of FIG. 6B. In this case, the direction in which the prism 24a transmits or reflects the light flux may change. In other words, in the comparative example, a combination of light fluxes may not be performed correctly.

In this way, the prism 24a and the prism 24b are abutted against the first positioning members 27 and the second positioning member 28 and positioned when they are adhered to the respective seating surfaces 26 by an adhesive, and the groove portion 29 receives the extra adhesive, so that the prism 24a and the prism 24b are easily fixed with high accuracy.

Figure 7:
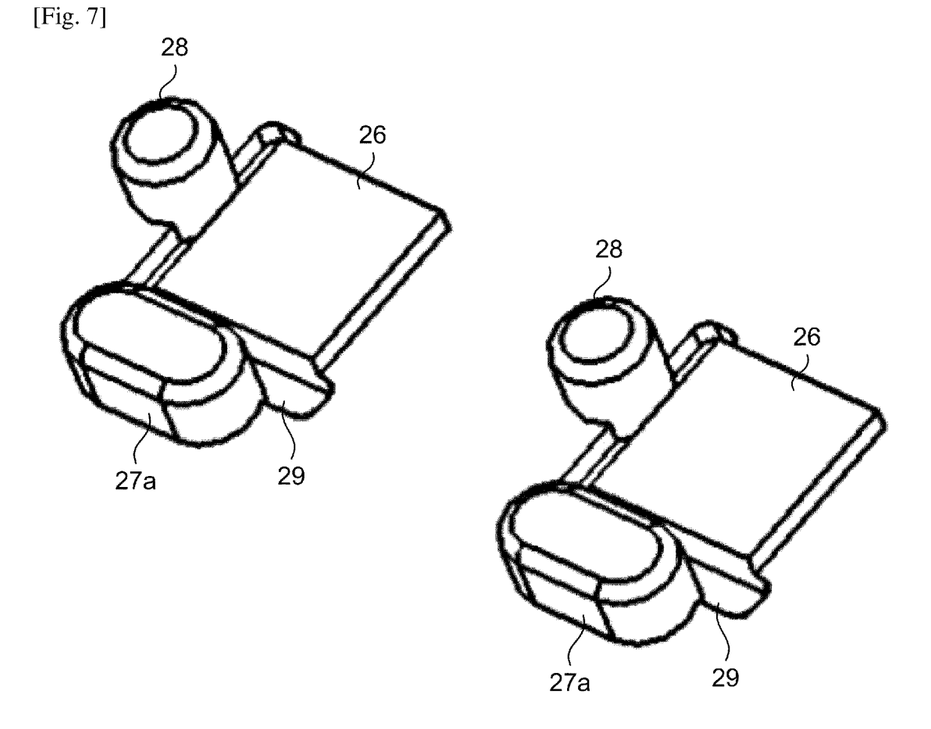
FIG. 7 is a perspective view illustrating a first modification of a positioning member that includes the first positioning members and the second positioning member.

Modifications of the positioning member including the first positioning members 27 and the second positioning member 28 will be explained next. FIG. 7 is a perspective view illustrating a first modification of the positioning member including the first positioning members and the second positioning member. As illustrated in FIG. 7, the first positioning members 27 including the two reference pins according to the embodiment may be configured by a first member 27a which is a single member (for example, widened).

Figure 8:
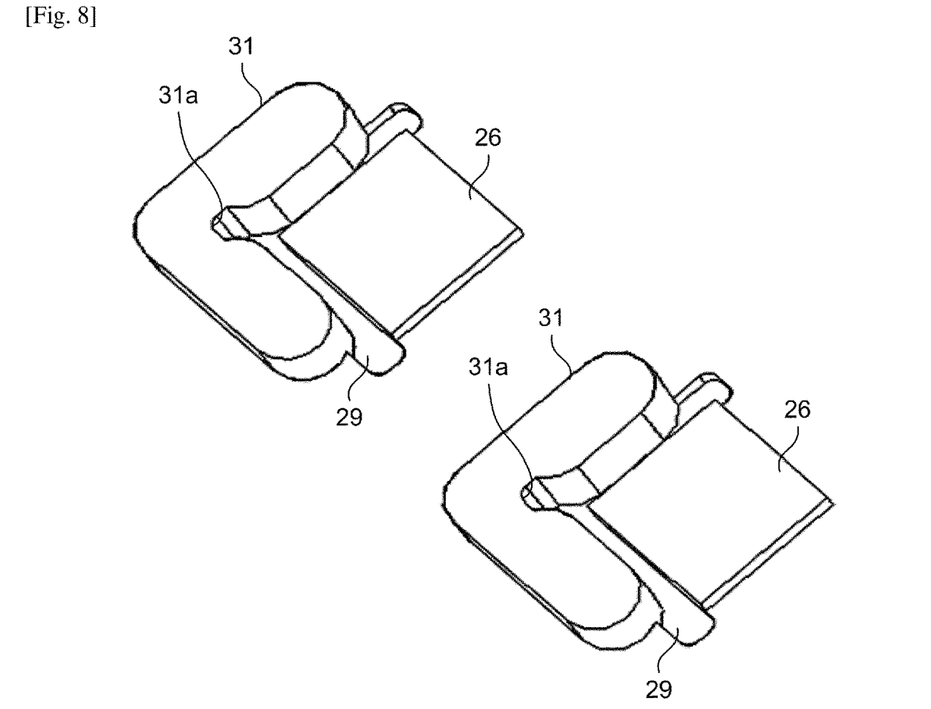
FIG. 8 is a perspective view illustrating a second modification of the positioning member.

FIG. 8 is a perspective view illustrating a second modification of the positioning member including the first positioning members and the second positioning member. As illustrated in FIG. 8, in the modification, the positioning member may be configured as a single member 31 that includes the first positioning members 27 and the second positioning member 28 according to the embodiment in an integrated fashion. The positioning member 31 includes two contact surfaces that are intersected each other and are contact with the prism 24a (or prism 24b), and is provided with a relief groove 31a at the intersection of the contact surfaces. By virtue of the relief groove 31a, the prism 24a (or prism 24b) can be reliably abutted against the contact surfaces of the positioning member 31 without contacting a corner of the prism 24a (or prism 24b) with the intersection of the contact surfaces of the positioning member 31. Because the two contact surfaces of the positioning member 31 in contact with the prism 24a (or prism 24b) can be processed at one time, high position accuracy can be achieved. Moreover, because the positioning member 31 can receive protrusion of the adhesive by the groove portion 29 and relief groove 31a, the adhesive can be prevented from being adhered to surfaces other the adhesive surface of the prism 24a (or prism 24b).

Figure 9:
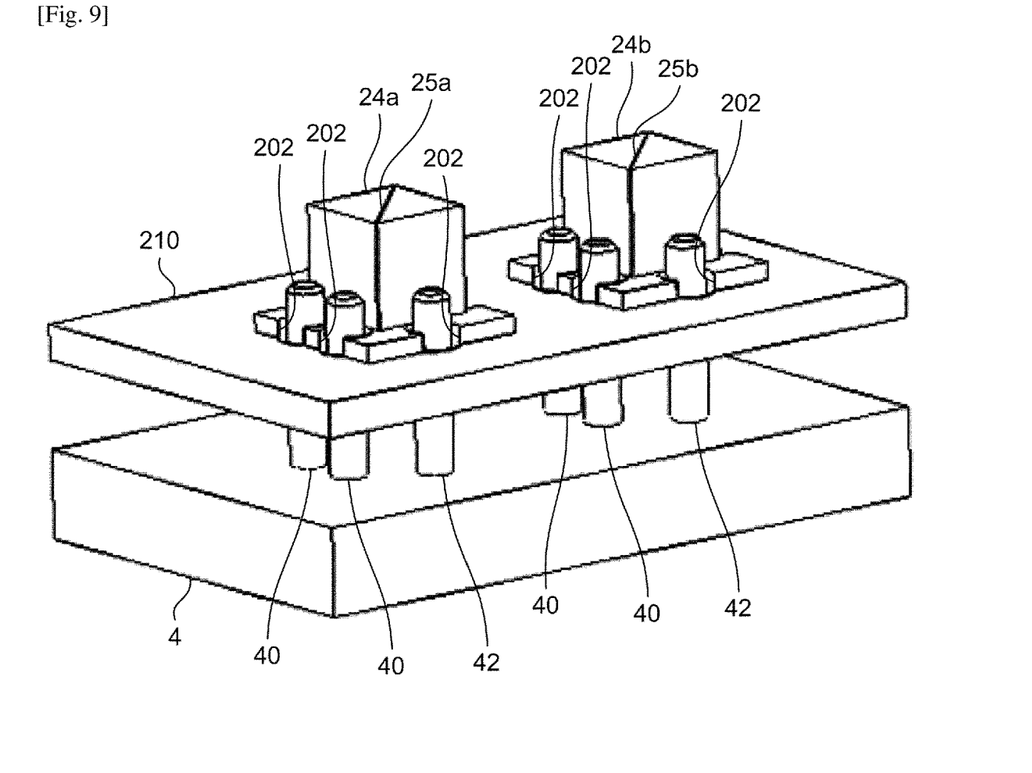
FIG. 9 is a perspective view illustrating a third modification of the positioning member.

FIG. 9 is a perspective view illustrating a third modification of the positioning member including the first positioning members and the second positioning member. As illustrated in FIG. 9, the first positioning members 27 and the second positioning member 28 according to the embodiment may be replaced with a plurality of first positioning members 40 and second positioning members 42 which are provided on a jig 4. The jig 4 is provided so that, for example, four first positioning members 40 and two second positioning members 42 extend upward.

For example, six openings 202 are provided in a substrate 210 in the housing 201 where the prism 24a and the prism 24b are fixed so that the first positioning members 40 and the second positioning members 42 provided on the jig 4 can pass from the lower side to the upper side, respectively. In addition, the substrate 210 includes thereon seating surfaces (not shown), and a groove portion (not shown) is provided in at least a part of the periphery of each of the seating surfaces. And, the openings 202 are formed at positions opposite to the respective seating surfaces across the respective groove portions. As set forth above, in the present invention, the seating surfaces may be formed separately from the substrate 210 or integrally with the substrate 210, thus, in the modification, also the seating surfaces (not shown) may be formed separately from the substrate 210 or integrally with the substrate 210.

The openings 202 are provided at positions corresponding to the first positioning members 27 and the second positioning member 28, and each diameter thereof is made larger than that of the first positioning members 40 and the second positioning members 42. In other words, the jig 4 is moved upward and downward at a predetermined position, which causes the first positioning members 40 and the second positioning members 42 to pass through or retract from the openings 202.

In the example illustrated in FIG. 9, when the prism 24a and the prism 24b are fixed by an adhesive, an operator adjusts the height of the jig 4 disposed below the substrate 210, and passes the first positioning members 40 and the second positioning members 42 through the openings 202 from the lower side so that the members are positioned lower than the optically effective areas 200a and 200b of the prism 24a and the prism 24b.

The operator applies the adhesive to the prism adhesive surfaces of the substrate 210, and sets up the prism 24a and the prism 24b thereon. At this time, the operator abuts the prism 24a and the prism 24b against the first positioning members 40 and the second positioning members 42 respectively to position, and ejects extra adhesive into the grooves provided at the periphery of the respective seating surfaces on the substrate 210. Thereafter, the operator cures the adhesive by UV irradiation or high temperature storage, lowers the jig 4 downward, and retracts the first positioning members 40 and the second positioning members 42 from the openings 202 to remove the first positioning members 40 and the second positioning members 42 together with the jig 4 from the housing 201.

REFERENCE SIGNS LIST

1 Display device
2 Prism unit (Optical device)
4 Jig
20a, 20b, 20c Light source
22a, 22b, 22c Coupling lens
23 Mirror
24a, 24b Prism
25a, 25b Dichroic film
26 Seating surface
26a Member surface
27, 27a First positioning member
28 Second positioning member
29 Groove portion
30 Adhesive applied position
31 Positioning member
40 First positioning member
42 Second positioning member
200a, 200b Optically effective area
202 Opening

CITATION LIST

Patent Literature

PTL 1: Japanese Patent No. 5398894

The invention claimed is:
1. An optical device, comprising:
a rectangular parallelepiped prism configured to include a reflection-transmission surface for reflecting and transmitting light fluxes;
a seating surface provided so that a bottom surface of the prism is fixed by an adhesive; and
a groove portion provided in at least a part of the periphery of the seating surface, wherein
the groove portion is configured to receive an excess portion of the adhesive protruded from between the bottom surface of the prism and the seating surface when the prism is pressed against a first positioning member to determine a position of the prism so that a first side face of the prism is along a predetermined straight line, and against a second positioning member to restrict a second side face orthogonal to the first side face of the prism from moving in the direction of the straight line, at the time of fixing the prism to the seating surface by the adhesive,
the optical device further comprises a member surface between the first positioning member and the groove portion and between the second positioning member and the groove portion, the member surface being a same height as the seating surface or lower than the seating surface, and being higher than the groove portion, and the adhesive does not exist at least around the first positioning member or the second positioning member between the member surface and the bottom surface of the prism.

2. The optical device according to claim 1, further comprising openings at positions opposite to the seating surface across the groove portion, wherein
the first positioning member and the second positioning member are provided at positions opposite to the seating surface across the groove portion by being introduced through the openings.

3. An optical device, comprising:
a rectangular parallelepiped prism configured to include a reflection-transmission surface for reflecting and transmitting light fluxes;
a seating surface provided so that a bottom surface of the prism is fixed by an adhesive;
a groove portion provided in at least a part of the periphery of the seating surface;
positioning members including a first positioning member and a second positioning member that position the prism on the seating surface; and
a member surface between the first positioning member and the groove portion and between the second positioning member and the groove portion, the member surface being a same height as the seating surface or lower than the seating surface, and being higher than the groove portion, wherein
the groove portion is configured to receive an excess portion of the adhesive protruded from between the bottom surface of the prism and the seating surface when the prism is pressed against the first positioning member to determine a position of the prism so that a first side face of the prism is along a predetermined straight line, and against the second positioning member to restrict a second side face orthogonal to the first side face of the prism from moving in the direction of the straight line, at the time of fixing the prism to the seating surface by the adhesive, and
the adhesive does not exist at least around the first positioning member or the second positioning member between the member surface and the bottom surface of the prism.

4. The optical device according to claim 3, wherein the first positioning member and the second positioning member are arranged so as to sandwich a plane including the reflection-transmission surface.

5. The optical device according to claim 3, wherein
the groove portion is formed so that a length in a first direction intersecting a second direction, which extends from the seating surface to the first positioning member or to the second positioning member, is longer than a length in the second direction.

6. The optical device according to claim 3, wherein the first positioning member and the second positioning member are arranged so as not to block a passage of the light flux.

7. The optical device according to claim 6, wherein
a height of the first positioning member and a height of the second positioning member are lower than positions of optically effective areas of the prism through which light fluxes pass.

8. The optical device according to claim 6, wherein the first positioning member includes two members provided so as to sandwich the optically effective area of the prism, from sides thereof, through which the light flux passes.

9. The optical device according to claim 3, wherein the first positioning member and the second positioning member are provided at positions opposite to the seating surface across the groove portion.

10. The optical device according to claim 3, wherein the positioning member is configured as a single member that includes the first positioning member and the second positioning member in an integrated fashion.

11. The optical device according to claim 10, wherein
the positioning member includes two contact surfaces that intersect each other and contact the prism, and
the positioning member is provided with a relief groove at an intersection of the contact surfaces.

12. An optical unit, comprising:
a laser light source configured to emit a laser light; and
the optical device according to claim 1,
wherein the prism provided with the reflection-transmission surface reflects a light flux of a predetermined wavelength and transmits a light flux of other wavelength of the laser light emitted by the laser light source.

13. A display device comprising:
the optical unit according to claim 12;
a two-dimensional deflecting portion configured to deflect the laser light emitted by the optical unit in a two-dimensional direction; and
a scanned surface element configured to be scanned with the laser light deflected by the two-dimensional deflecting portion in the two-dimensional direction.

14. A prism fixing method for fixing a rectangular parallelepiped prism to a seating surface by an adhesive, a groove portion provided in at least a part of the periphery of the seating surface, the prism including a reflection-transmission surface for reflecting a light flux of a predetermined wavelength and transmitting a light flux of other wavelength and being surrounded by at least four apexes and a bottom surface, the prism fixing method comprising:
pressing the prism against a first positioning member to determine a position of the prism so that a first side face of the prism is along a predetermined straight line, and against a second positioning member to restrict a second side face orthogonal to the first side face of the prism from moving in a direction in which the straight line extends; and
receiving an excess portion of the adhesive protruded from between the bottom surface of the prism and the seating surface into the groove portion so that the adhesive does not reach the first positioning member and the second positioning member between the bottom surface of the prism and a member surface between the first positioning member and the groove portion and between the second positioning member and the groove portion, the member surface being a same height as the seating surface or lower than the seating surface, and being higher than the groove portion.

15. The optical device of claim 1, wherein the groove portion has parallel sides.

* * * * *